United States Patent
Shinohara

[11] Patent Number: 5,238,878
[45] Date of Patent: Aug. 24, 1993

[54] FILM FORMING METHOD BY SPIN COATING IN PRODUCTION OF SEMICONDUCTOR DEVICE

[75] Inventor: Masahide Shinohara, Tokyo, Japan
[73] Assignee: NEC Corporation, Tokyo, Japan
[21] Appl. No.: 19,056
[22] Filed: Feb. 18, 1993
[30] Foreign Application Priority Data
  Feb. 18, 1992 [JP] Japan .................... 4-29842
[51] Int. Cl.$^5$ .......................................... H01L 21/469
[52] U.S. Cl. ..................... 437/231; 148/DIG. 17; 134/33; 427/240
[58] Field of Search ............ 437/231, 10, 225, 229; 134/33; 148/DIG. 17, DIG. 75; 427/240

[56] References Cited

U.S. PATENT DOCUMENTS

| | | | |
|---|---|---|---|
| 4,113,492 | 9/1978 | Sato et al. | 427/240 |
| 4,510,176 | 4/1985 | Cuthbert et al. | 427/82 |
| 4,518,678 | 5/1985 | Allen | 430/311 |
| 5,001,084 | 3/1991 | Kawai et al. | 437/231 |
| 5,127,362 | 7/1992 | Iwatsu et al. | 118/667 |
| 5,159,374 | 10/1992 | Groshong | 354/317 |

FOREIGN PATENT DOCUMENTS

| | | | |
|---|---|---|---|
| 55-12750 | 1/1980 | Japan | 427/240 |
| 55-103728 | 8/1980 | Japan | 437/231 |
| 61-184824 | 8/1986 | Japan | 437/231 |
| 3-145715 | 6/1991 | Japan | 437/231 |

OTHER PUBLICATIONS

Decker, S. K., et al., "Spin Coating Edge Build-Up Elimination" *IBM Tech. Disc. Bull.*, vol. 20, No. 10, Mar. 1978, pp. 4082-4083.

*Primary Examiner*—T. N. Quach

[57] ABSTRACT

Upon the formation of a film on a semiconductor substrate by spin coating method, a polyimide precursor solution as a film forming solution is supplied dropwise onto the semiconductor substrate, and then the semiconductor substrate is started to be rotated at a low revolving speed of 1,000 rpm while pure water as an adhesion protecting liquid is injected upon the backside of the semiconductor substrate. By this operation, the polyimide precursor solution is spread out over the above surface of the semiconductor substrate by the rotation thereof. On the other hand, pure water is injected on the backside of the substrate before the dropped solution reaches the periphery of the substrate. As a result, the polyimide precursor liquid is prevented from going around to the backside of the substrate by the injection of pure water, thus protecting the adhesion of the polyimide precursor solution onto the backside of the substrate.

10 Claims, 4 Drawing Sheets

FILM FORMING METHOD BY SPIN COATING IN PRODUCTION OF SEMICONDUCTOR DEVICE

BACKGROUND OF THE INVENTION (1) Field of the Invention

The present invention relates to a process for producing a semiconductor device, and more particularly, to a film forming method by spin coating technique.

(2) Description of the Related Art

In the manufacturing process of semiconductor devices, spin coating method has been widely used in order to form a film of an organic solvent on a substrate. That is, the organic solvent is supplied dropwise on a surface of the substrate as it is rotated. Meanwhile, for semiconductor devices, a stress is generated between a mold resin and a passivation film, in dependence upon variation of temperature. The stress becomes large as the dimension of semiconductor chip is increased. In order to relieve this kind of stress, a polyimide layer may, in some cases, be provided between the mold resin and the passivation film. The above mentioned spin coating method would be used to form such a polyimide layer, for instance.

In order for the polyimide layer to function as a buffer layer relieving the stress generated under the influence of temperature changes, the polyimide layer must be enough thick. To obtain such a polyimide layer with a sufficient thickness, it is necessary to use a polyimide precursor solution having a high viscosity. When the polyimide precursor solution with a high viscosity is coated to a semiconductor substrate as it is rotated, the polyimide precursor solution cannot be thrown away and removed from the periphery of the semiconductor substrate. As a result, the polyimide precursor solution adheres to the backside of the substrate. The adhesion of the polyimide precursor solution of a high viscosity onto the backside of the substrate may induce generation of dust.

In order to prevent the adhesion, a solvent (to be referred to as a backside-rinsing liquid) is discharged so as to dissolve and remove the polyimide precursor liquid adhered on the backside of the substrate.

FIG. 1 is a cross-sectional view of a rotatory applicator, whereas FIG. 2 is a timing chart showing a sequence of coating of a polyimide film in which the polyimide precursor solution is removed using a conventional backside-rinsing liquid. In FIG. 2, axis of abscissa represents processing time, and axis of ordinate represents revolving speed of a semiconductor substrate.

As shown in FIG. 1, the spin coater has a housing 16 comprising a lower cup 13 and an upper cup 12 disposed above the lower cup 13, and the thus constructed housing 16 holds a semiconductor substrate 16 therein. The lower cup 13 is provided with a drain hose 17 for letting liquid run out.

The upper cup 12 is provided at the center thereof with an opening 19, through which an organic solution can be dropped into the housing from a nozzle 11 for supplying the droplet of organic solution. The injecting nozzle 11 is driven by a driver unit 23 to drop a predetermined amount of an organic solution.

Inside the housing, a vacuum chuck 14 for supporting and holding semiconductor substrate 16 is fixed to a vertical rotary shaft 18 with its substrate supporting face horizontal. A semiconductor substrate 16 is set on the supporting face of vacuum chuck 14, and is vacuumed and sucked to be fixed by vacuum chuck 14. As rotary shaft 18 is driven by a driver unit 22, semiconductor substrate 16 thus fixed on vacuum chuck 14 is rotated by driver unit 22 about a vertical axis at the center thereof.

Inside lower cup 13, a nozzle 15 for discharging backside-rinsing liquid is provided under the periphery of semiconductor 16 mounted on vacuum chuck 14, so as to discharge and inject a backside-rinsing liquid on a backside (underside) of semiconductor substrate 16. The discharging nozzle 15 is driven by a driver unit 24 to discharge backside-rinsing liquid in a predetermined amount.

These driver units 22, 23 and 24 are regulated by a controller 21. Now, operation of the spin coater shown in FIG. 1 will be described based on controlling features of controller 21 with reference to a timing chart shown in FIG. 2.

At step 1 shown in FIG. 2 (a period for dropping coating liquid), organic solution-discharge nozzle 11 controlled by driving unit 23 supplies polyimide precursor solution dropwise onto the surface of semiconductor substrate 16 kept at rest.

Next, semiconductor substrate 16 is driven by means of driver unit 22, to raise its revolving speed to 1,000 rpm. At step 2 shown in FIG. 2 (period of rotation at low revolving speed), substrate 16 is rotated at a low revolving speed of 1,000 rpm for five seconds. This rotation at low revolving speed spreads out the dropped polyimide precursor solution over the surface of the substrate 16. This step is called pre-spinning.

Next, the revolving speed of substrate 16 is further raised to 3,000 rpm, and at step 3 (a period of rotation at high revolving speed), substrate 16 is rotated at a high revolving speed of 3,000 rpm for 20 seconds. This rotation is to regulate the thickness of the polyimide film to a desired dimension. The step 3 is called main spinning.

Then, at step 4, with keeping substrate 16 rotating at the same revolving speed as in the main spinning, dimethylacetamide (to be abbreviated as DMAc hereinafter) is injected from nozzle 15 for injecting backside-rinsing liquid by means of driver unit 24. The thus injected DMAc is directed toward the backside of the substrate for thirty seconds, to thereby dissolve and remove the polyimide film adhered onto the backside of the substrate.

At step 5 (a period for drying), the discharge of DMAc is stopped while substrate 16 is kept on rotating for forty seconds at a high revolving speed of 3,000 rpm. During this, the backside of substrate 16 is dried by air flow.

It is known that when a photo-resist film is formed by the spin coating method, ketone is used as a backside-rinsing liquid. On the other hand, in a case where a SOG (spin on glass) film is formed by coating a Si-containing alcohol solution using the spin coating method, alcohols are used as a backside-rinsing liquid. These backside-rinsing liquids are also used, in the same way as the polyimide film is formed, so as to dissolve and remove the film adhered on the backside of substrate.

However, in the case where a film, for example, of polyimide is formed on a substrate by the conventional spin coating method, first, the polyimide film is regulated to a desired thickness (step 3), and thereafter, a solvent must be discharged from the backside-rinsing liquid discharging nozzle 15 while the substrate being rotated at the same revolving speed (step 4). For this reason, the processing takes long time, disadvantageously.

On the other hand, it takes an extremely long time if use of N-methylpyrolidone (to be abbreviated as NMP hereinafter) is made as a solvent for dissolving and removing the polyimide precursor solvent adhered on the backside of substrate 16. For this reason, it is necessary to use a stronger solvent than NMP, such as, for instance DMAc, dimethylformamide (DMF), etc. However, even with DMAc or DMF, it takes about thirty seconds to dissolve and remove the polyimide precursor solution, as shown in FIG. 2. To make matter worse, these solvents exhibit poor volatility, so that the substrate must be spun at a high revolving speed for a long period of time (about forty seconds) in order to dry the solvent (step 5). As a result the processing time for each substrate takes as an extremely long time as about two minutes.

In addition, since the substrate is spun at a high revolving speed for a long period, this poses a problem that the film of polyimide precursor on the substrate surface is made thinner than what is desired. Furthermore, DMAc, DMF, etc. which have strong solvency should be used as the backside-rinsing liquid.

In the case where photo-resist film or SOG film is formed, the solution adhered on the backside of the substrate must be dissolved and removed after the film of a desired thickness has been formed. Accordingly, the processing time for each substrate in these cases also needs a long period of time like the above case of the polyimide film-forming.

On the contrary, if the backside-rinsing liquid is not used, a polyimide precursor solution of a low viscosity must be used. In this case, it is true that, by lowering the viscosity of the polyimide precursor solution, the polyimide precursor solution in the periphery of substrate can completely be thrown away so as to avoid its adhesion onto the backside of substrate. But, if the viscosity of the polyimide precursor solution is low, a series of Steps 1, 2 and 3, that is, the spin coating treatment of the polyimide film must be repeated in order to obtain a film of a desired thickness. So, this method cannot eliminate the drawback of low throughput, either.

SUMMARY OF THE INVENTION

It is therefore an object of the present invention to provide a film forming method in production of semiconductor device which allows a processing time for treating each semiconductor substrate to be shortened to thereby perform a speedy spin coating.

In accordance with the present invention, a film forming method in production of semiconductor device comprises the steps of:

supplying a film-forming solution dropwise on the surface of a semiconductor substrate;

starting rotation of the semiconductor substrate; and starting a discharge of an adhesion protecting liquid onto the backside of the semiconductor substrate before the film-forming solution supplied on the above surface of the semiconductor substrate is spread out to the periphery of the substrate.

In the present invention, the rotation of the semiconductor substrate is started after dropping of the application solution, and then the discharge of the adhesion protecting liquid onto the backside of the semiconductor substrate is started before the applied solution reaches the periphery of the substrate. By this operation, the tendency of the applied solution to go around to the backside of the semiconductor substrate is protected by the adhesion protection liquid, thus the applied solution is prevented from adhering on the backside of the substrate.

In accordance with the present invention, in place of dissolving and removing the adhered solution, the solution itself is prevented from adhering onto the backside of the substrate by discharging and injecting the adhesion protecting liquid. This results in reduction of processing time. The liquid to be injected on the backside of the substrate can be selected regardless of the solvency against the solution to be coated. Accordingly, pure water or lower alcohols having high volatility can be of use as the adhesion protecting liquid. As a result, this feature of the present invention can perform further reduction of the processing time, and allows the use of harmless liquid.

DETAILED DESCRIPTION OF THE PREFERRED EMBODIMENTS

Figure 1:
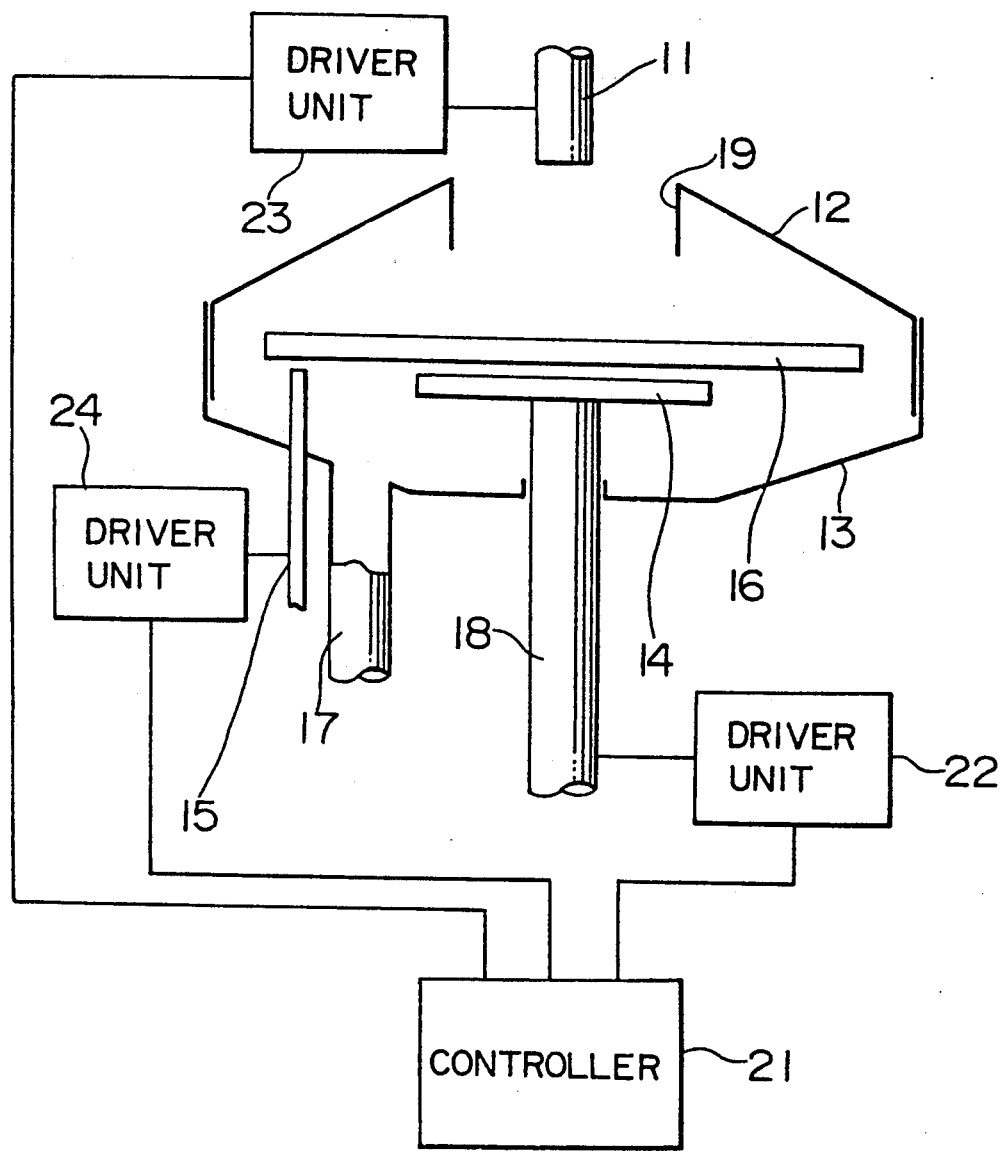
FIG. 1 is an schematic diagram showing a typical spin coater.
Figure 3:
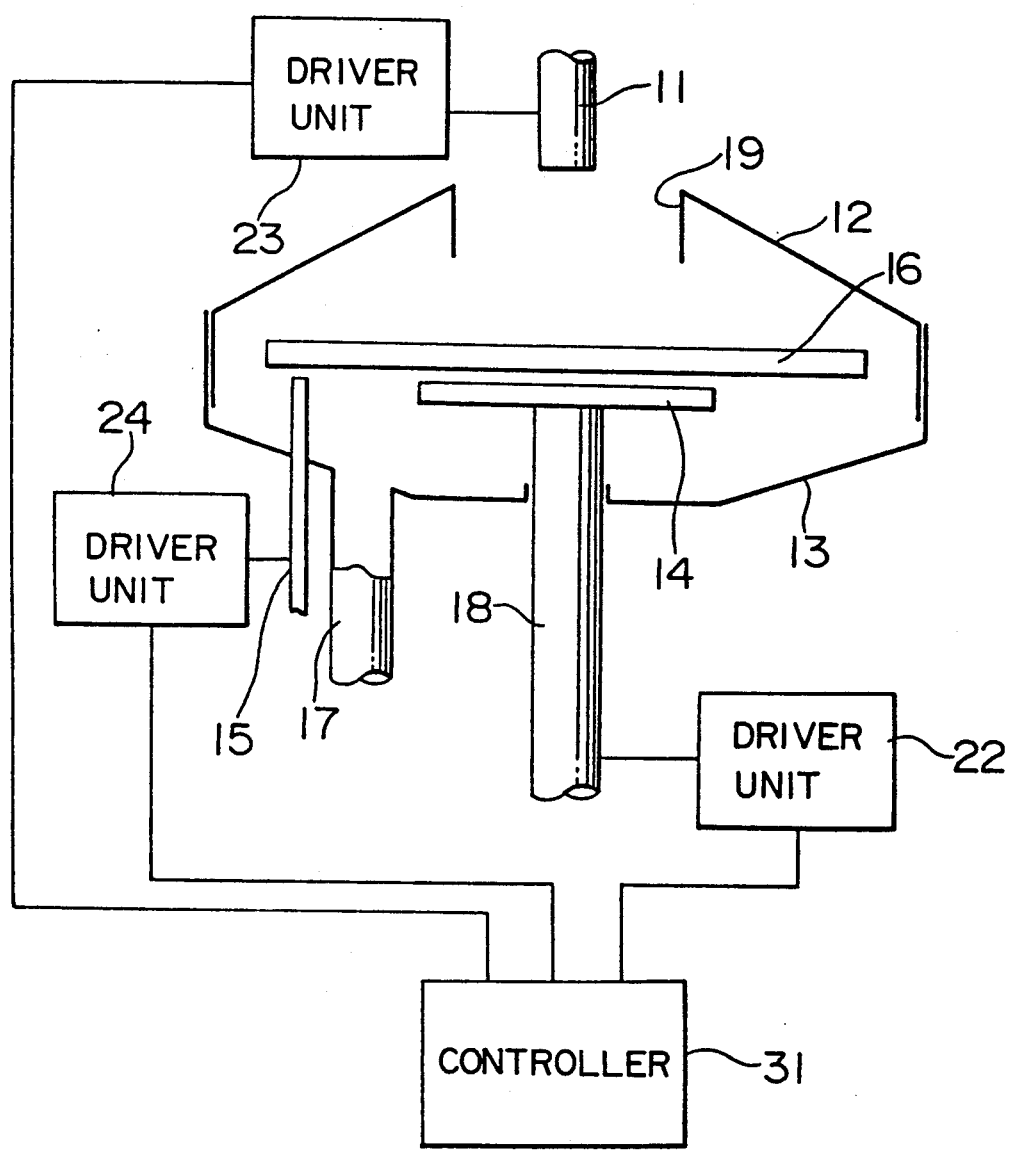
FIG. 3 is a schematic diagram showing a typical spin coater used for a method of an embodiment of the present invention.
Figure 4:
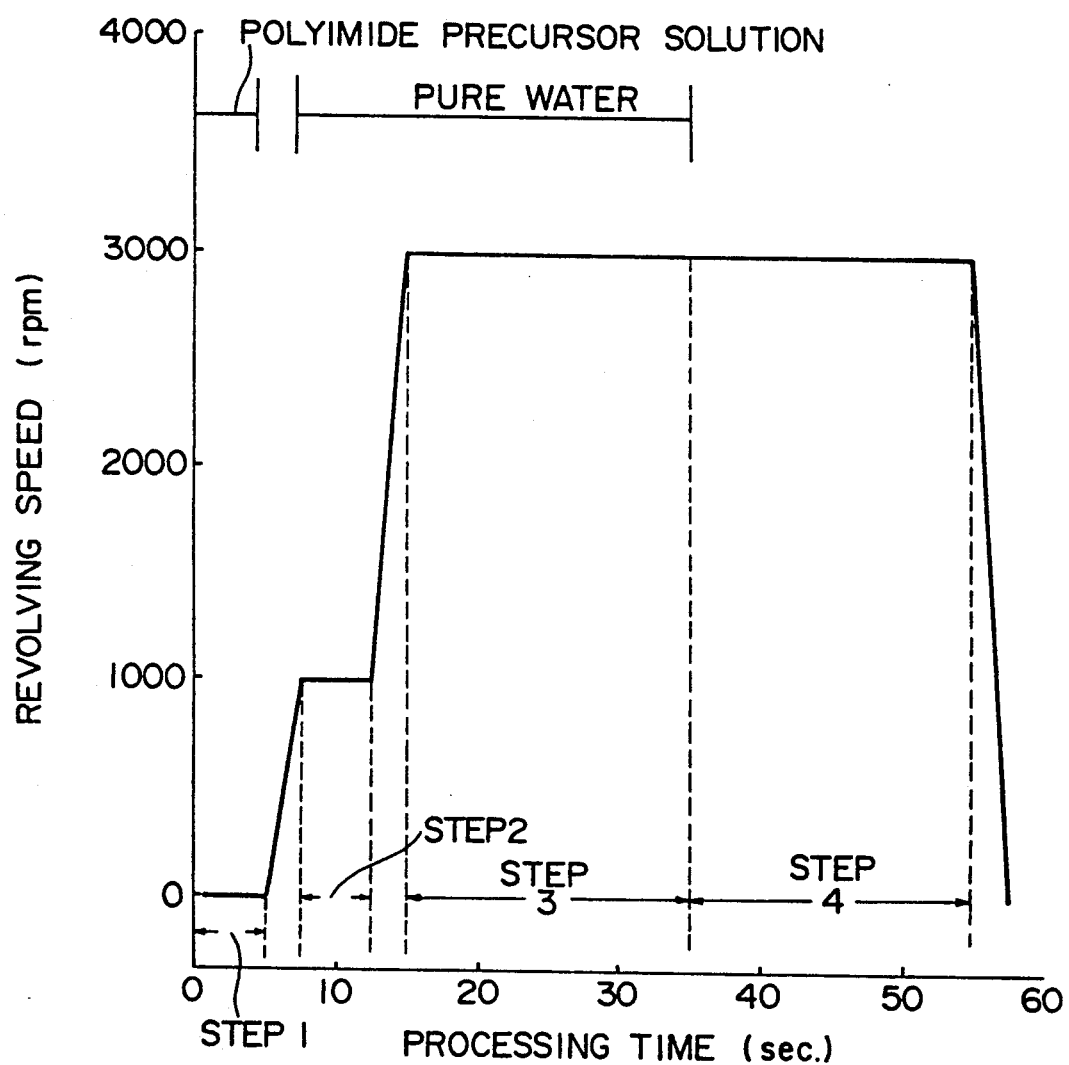
FIG. 4 is a timing chart showing a method in an embodiment of the present invention.

Embodiments of the present invention will hereinafter be described with reference to the accompanying drawings. FIG. 4 is a timing chart of polyimide film coating as to a first embodiment of the invention. A spin coater used in this embodiment has an identical structure, as shown in FIG. 3, with the conventional spin coater in FIG. 1, and differs from the conventional one only in the controlling features and the kind of liquid that is discharged from discharging nozzle 15. Specifically, the liquid discharged from discharging nozzle 15 is different from the solvent used in the prior art, and employs a solvent with a weak solvency such as pure water, or lower alcohol, etc as an adhesion protecting liquid. Accordingly, in FIG. 3, like components effecting the same functions with those in FIG. 1 are identified by like reference numerals and the description in detail will not be repeated.

The method of the embodiment will be described with reference to FIG. 4 which shows an operational features of a controller 31 used in this embodiment. First, as shown in FIG. 3, semiconductor substrate 16 is fixed to vacuum chuck 16. Then, polyimide precursor solution having a viscosity of 5,000 cp is dropped onto the surface of substrate 16 from organic solution injecting nozzle 11 for five seconds (step 1; a period of dropping of coating liquid).

Next, rotation of substrate 16 is started to raise the revolving speed of substrate 16 to 1,000 rpm. At a next step 2 (a period of low speed rotation), substrate 16 is spun at 1,000 rpm for five second as a pre-spinning. This operation spreads out the dropped polyimide precursor solution over the surface of substrate 16.

On the other hand, at the time when the revolving speed of substrate 16 reaches 1,000 rpm, pure water as the adhesion protecting liquid is discharged from liquid discharging nozzle 15 and injected onto the backside of substrate 16.

Then, the revolving speed of substrate 16 is raised up to 3,000 rpm at which desired thickness of polyimide could be obtained, and at step 3 (a period of rotation at high revolving speed), substrate 16 is rotated at a high revolving speed of 3,000 rpm for 20 seconds. At step 3, a continuous discharge of pure water is kept on so as to inject water on the backside of substrate 16.

At a next step 4 (a period for drying), the discharge of water is stopped while substrate 16 is kept on rotating for twenty seconds at a high revolving speed of 3,000 rpm. During this, the backside of substrate 16 is dried by air flow.

Figure 2:
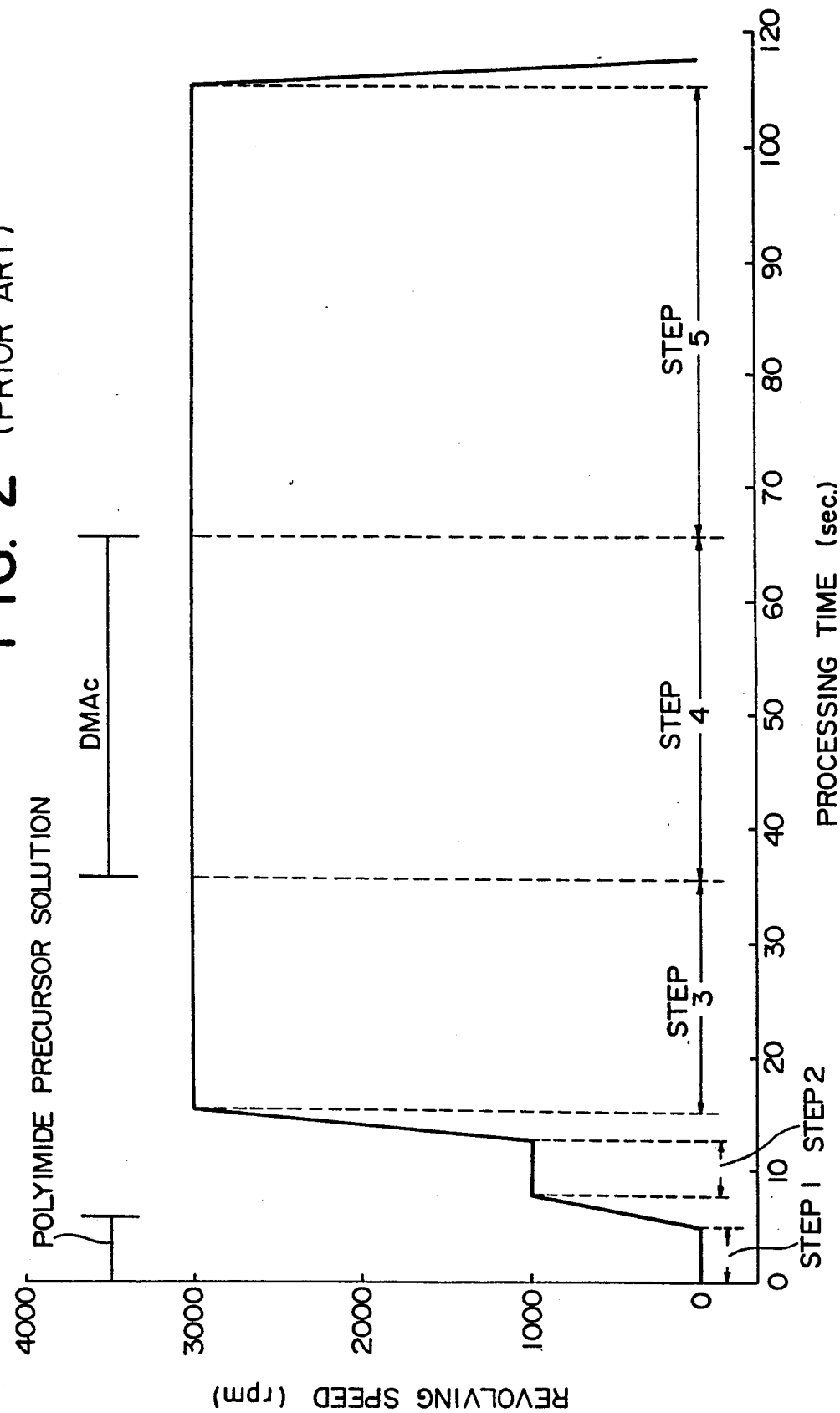
FIG. 2 is a timing chart showing a method of prior art film forming.

As described heretofore, according to the present embodiment, semiconductor substrate 16 as is rotated is supplied with a polyimide precursor solution dropwise on the above surface thereof while water is discharged and injected on the backside of semiconductor substrate 16. Therefore, dissolving treatment by DMAc, as executed in the prior art shown in FIG. 2, for the polyimide film that would be formed on the backside of substrate 16 is no longer needed. As a result, the time taken for step 3 (in the present embodiment) in which a high speed rotation is effected is reduced to about one-third of that for the high speed rotation in steps 3 and 4 (in the prior art). In addition, the drying time required for the present invention (step 4 in the present embodiment) can be reduced to half of the drying time required for the prior art process (step 5 in the prior art).

Consequently, the processing time for each semiconductor substrate can be sharply shortened from 120 seconds (in the prior art) to 60 seconds (in the invention).

It should be noted that the start of discharging the liquid for protecting adhesion is not required to be in time with the start of the low speed rotation of semiconductor substrate. That is, the discharge of the liquid for protecting adhesion may and must be started at any time before the liquid for film-forming (the organic solution) supplied on the substrate surface reaches the periphery of the substrate.

In the description of the above embodiment, although pure water is used as an adhesion protecting liquid to prevent the organic solution from adhering onto the backside of substrate, lower alcohols such as ethyl alcohol, isopropyl alcohol (IPA), etc. can be employed as the adhesion protecting liquid. Since the lower alcohols have higher volatility than pure water, the drying step is completed in about 10 seconds. As a result the total processing time can further be shortened.

Although the description of the embodiment heretofore has been made as to a case in which polyimide film is formed, it is also possible, in the cases in which photoresist film or SOG film is formed, to prevent the organic solution from adhering onto the backside of substrate by controlling the discharge timing of the adhesion protecting liquid in the similar sequence. Accordingly, the time for each substrate spent in forming these films can also be shortened.

What is claimed is:

1. A film forming method in production of semiconductor device comprising the steps of:
    supplying a film-forming solution dropwise on the surface of a semiconductor substrate;
    starting rotation of said semiconductor substrate; and,
    starting a discharge of an adhesion protecting liquid onto the backside of said semiconductor substrate before said film-forming solution supplied on the above surface of said semiconductor substrate is spread out to the periphery of said substrate.

2. A film forming method according to claim 1, wherein said semiconductor substrate is rotated at a first revolving speed immediately after the start of rotation, and thereafter, is shifted to a rotation at a second revolving speed higher than the first revolving speed.

3. A film forming method according to claim 2, wherein discharge of said adhesion protecting liquid is started in synchronization with the start of the rotation at said first revolving speed, and is stopped at a time when a certain period of time has been passed after the start of the rotation at said second revolving speed.

4. A film forming method according to claim 3, wherein, after the discharge of said adhesion protecting liquid is stopped, said semiconductor substrate is kept on being rotated at said second revolving speed for a certain period of time in order to dry the adhesion protecting liquid on the backside thereof.

5. A film forming method according to claim 4, wherein said first revolving speed is about 1000 rpm.

6. A film forming method according to claim 5, wherein said second revolving speed is about 3000 rpm.

7. A film forming method according to claim 1, wherein said adhesion protecting liquid is pure water or a lower alcohol.

8. A film forming method according to claim 1, wherein said film-forming solution is a polyimide precursor solution.

9. A film forming method according to claim 1, wherein said film-forming solution is a photo-resist solution.

10. A film forming method according to claim 1, wherein said film-forming solution is a silicon-containing organic solution.

* * * * *